United States Patent [19]

Hirata

[11] Patent Number: 4,833,687
[45] Date of Patent: May 23, 1989

[54] DISTRIBUTED FEEDBACK SEMICONDUCTOR LASER

[75] Inventor: Shoji Hirata, Tokyo, Japan

[73] Assignee: Sony Corporation, Tokyo, Japan

[21] Appl. No.: 942,269

[22] Filed: Dec. 16, 1986

[30] Foreign Application Priority Data

Dec. 18, 1985 [JP] Japan ................................ 60-285295

[51] Int. Cl.$^4$ .............................................. H01S 3/08
[52] U.S. Cl. ........................................ 372/96; 372/18; 372/46
[58] Field of Search ....................... 372/44, 45, 46, 96, 372/43, 18, 19, 32; 350/96.12

[56] References Cited

U.S. PATENT DOCUMENTS

| | | | |
|---|---|---|---|
| 4,163,976 | 8/1979 | Matsumoto | 372/46 |
| 4,178,064 | 12/1979 | Nakamura et al. | 357/18 |
| 4,302,729 | 11/1981 | Burnham et al. | 372/96 |
| 4,518,219 | 5/1985 | Leonberger et al. | 350/96.12 |
| 4,716,570 | 12/1987 | Yoshida et al. | 372/46 |

FOREIGN PATENT DOCUMENTS

| | | | |
|---|---|---|---|
| 0056385 | 5/1979 | Japan | 372/46 |
| 0028385 | 2/1982 | Japan | 372/46 |
| 0178134 | 10/1985 | Japan | . |
| 0195425 | 3/1986 | Japan | . |

OTHER PUBLICATIONS

Matsumoto, "Bent Guide Structure Semiconductor Lasers", Jul.–Aug. 1978, pp. 1027–1044; Review of the Electrical Communication Laboratories.

*Primary Examiner*—William L. Sikes
*Assistant Examiner*—B. R. R. Holloway
*Attorney, Agent, or Firm*—Ronald P. Kananen

[57] ABSTRACT

A distributed feedback semiconductor laser is provided with an optical waveguide having first and second straight-bar portions and a bending portion. The pitch of the grating in the case of light passing through the bending portion is a little longer than that in the case of light passing through the first and second straight-bar portion in order to shift the phase of the light transmitted along the optical waveguide by $\lambda/4$ where $\lambda$ is the oscillation wavelength, thereby generating single longitudinal mode laser light.

17 Claims, 2 Drawing Sheets

DISTRIBUTED FEEDBACK SEMICONDUCTOR LASER

BACKGROUND OF THE INVENTION

1. Field of the Invention

The present invention relates generally to a distributed feedback semiconductor laser. More specifically, the invention relates to a distributed feedback semiconductor laser which can oscillate in a single longitudinal mode.

2. Description of the Prior Art

In a distributed feedback semiconductor laser, oscillation in a single longitudinal mode is desirable. Conventional distributed feedback semiconductor lasers have used gratings which are arranged in a regular pitch for distributively feeding the light back by Bragg reflection. However, it has been difficult to generate a single longitudinal mode in conventional distributed feedback semiconductor lasers, since often two longitudinal modes of light are generated thereby producing a mode-hopping.

In order to eliminate the aforementioned disadvantage and to achieve a single longitudinal mode, distributed feedback semiconductor lasers have been proposed which can change pitch near the center of gratings for generating a $\pi$ phase difference, that is, $\lambda/4$ phase shift where $\lambda$ is the oscillation wavelength.

However, it is difficult to manufacture an accurate grating which can change pitch near the center gratings. Thus there is a possibility of manufacturing a large quantity of inferior goods thus lowering the yield of lasers manufactured.

SUMMARY OF THE INVENTION

It is therefore a principle object of the present invention to eliminate the aforementioned disadvantage and to provide a distributed feedback semiconductor laser which can oscillate in a single longitudinal mode.

It is another object of the present invention to provide a distributed feedback semiconductor laser which can oscillate in a single longitudinal mode without having to manufacture an accurate grating to change its regular pitch and without lowering the yield of manufacturing of lasers.

In order to accomplish the aforementioned and other specific objects, a distributed feedback semiconductor laser is provided with an optical waveguide having first and second straight-bar portions and a bending portion. The pitch of the grating in the case of light passing through the bending portion is a little longer than that in the case of light passing through the first and second straight-bar portions thus shifting the phase of the light transmitted along the optical waveguide by $\lambda/4$ where $\lambda$ is the oscillation wavelength, thereby generating a single longitudinal mode.

According to one aspect of the present invention, a distributed feedback semiconductor laser comprises: a first cladding layer, an active layer disposed on the upper surface of the first cladding layer, a guiding layer disposed on the upper surface of the active layer, said guiding layer having gratings, a second cladding layer disposed on the upper surface of the guiding layer, said second cladding layer having an optical waveguide and means for shifting the phase of the light transmitted along said optical waveguide by $\lambda/4$ where $\lambda$ is the oscillation wavelength. The gratings are preferably arranged in a regular pitch having a triangular cross section. The means may oscillate single longitudinal mode laser light by use of an optical waveguide comprising: a first straight-bar portion extending perpendicular to the direction in which the upper edge and bottom of said grating extends, a bending portion extending at an angle from the first straight-bar portion, and a second straight-bar portion extending parallel to said first straight-bar portion. The relationship between the length l of the bending portion and the angle $\theta$ of the bending portion relative to the first and second straight-bar portion is subject to the following formula:

$$l = (\tfrac{1}{2} + m)\left(\frac{\Lambda_0}{n}\right)\frac{1}{1 - \cos\theta}$$

in which $\theta$ is not 0°, $\Lambda_0$ is the pitch when $\theta = 0°$, n is the degree of the grating, and m is an integer. The length l of the bending portion is preferably less than about one-tenth of whole length of the layer. The angle $\theta$ is preferably is less than 10°. The grating may be provided on the upper surface of the active layer. The optical waveguide may be provided on the upper surface of the second cladding layer. The optical waveguide has a rectangular section. The optical waveguide may be a ridge waveguide. The bending portion may also comprise a smooth curved bar.

BRIEF DESCRIPTION OF THE DRAWINGS

The present invention will be understood more fully from the detailed description given herebelow and from the accompanying drawings of the preferred embodiment of the invention. However, the drawings are not intended to imply limitation of the invention to this specific embodiment, but are for explanation and understanding only.

In the drawings.

DESCRIPTION OF THE PREFERRED EMBODIMENTS

Figure 1:
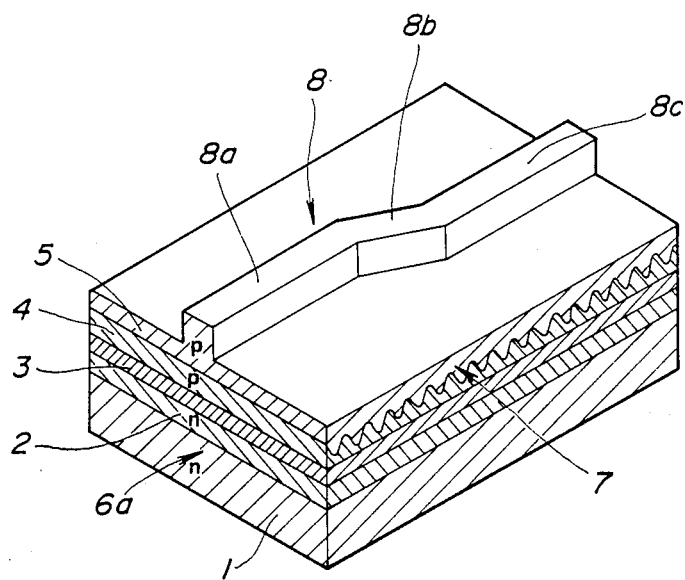
FIG. 1 is a perspective view of a preferred embodiment of a distributed feedback semiconductor laser according to the present invention.

Referring now to the drawings, particularly to FIG. 1, the preferred embodiment of a distributed feedback semiconductor laser, according to the present invention, includes: a n-type GsAs substrate 1; a first cladding layer 2, such as a n-type $Al_xGa_{1-x}As$ layer, disposed on the upper surface of the n-type GaAs substrate 1; an active layer 3, such as a $Al_yGa_{1-y}As$ (y<x) layer, disposed on the upper surface of the cladding layer 2; a guiding layer 4, such as a p-type $Al_zGa_{1-z}As$ (y<z<x) layer, disposed on the upper surface of the active layer 3; a second cladding layer 5, such as a p-$Al_xGa_{1-x}As$ layer, disposed on the upper surface of the guiding layer 4.

Figure 2:
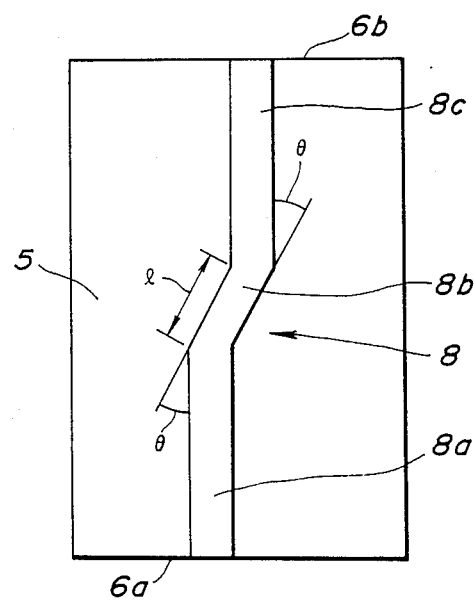
FIG. 2 is a plan view of a distributed feedback semiconductor laser in FIG. 1.

Gratings 7 are provided on the upper surface of the guiding layer 4. The gratings 7 are arranged in a regular pitch having a triangular cross section. The upper edge and bottom of said the grating extend in the direction parallel to end faces 6a and 6b. In addition, as shown in FIGS. 1 and 2, the second cladding layer 5 is provided with a ridge waveguide 8 projecting upwardly. The ridge waveguide 8 has a rectangular cross section and extends from the end face 6a to the opposing end face 6b. The ridge waveguide 8 comprises a first straight-bar portion 8a, a bending portion 8b and a second straight-bar portion 8c. The first straight-bar portion 8a extends from the end face 6a toward the center of the upper surface of the second cladding layer 5 in the direction perpendicular to the end face 6a. The bending portion 8b extends at an angle $\theta$ from the first straight-bar portion 8a, the length of said bending portion being l. The second straight-bar portion 8c extends from the end of the bending portion 8b to the opposing end face 6b in the direction parallel to the first straight-bar portion 8a.

Figure 3:
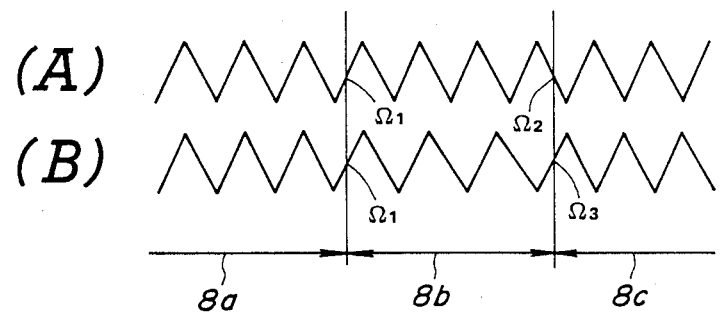
FIG. 3 is a diagram showing the principle of $\lambda/4$ phase shift.

It is described below how to determine the length l of the bending portion 8b of the ridge waveguide 8 and the angle thereof from the first straight-bar portion 8a and the second straight-bar portion 8c. In the case where the upper edge and bottom of the the grating 7 extend in the direction parallel to the end faces 6a and 6b as mentioned above, the grating pitch $\Lambda'$ (FIG. 3) in the bending portion 8b can be expressed by following formula, if the pitch is labelled with $\Lambda_0$ when the angle $\theta = 0°$:

$$\Lambda' + \frac{\Lambda_0}{\cos\theta} \quad (1)$$

As seen from the formula (1), the grating pitch, where the light passes through, in the region corresponding to the bending portion 8b near the center of the ridge waveguide 8 is a little longer than that in the straight-bar portions 8a and 8c as shown in FIG. 3(B). Furthermore, the grating pitch, in the case of the straight ridge waveguide having no ending portion, is shown in FIG. 3(A).

If the grating phases $\Omega_1$, $\Omega_2$ and $\Omega_3$ are determined so as to be shown in FIGS. 3(A) and (B), the following formulae can be applied:

$$\Omega_2 = \frac{2\pi n l}{\Lambda_0} + \Omega_1 \quad (2)$$

$$\Omega_3 = \frac{2\pi n l}{\Lambda'} + \Omega_1 \quad (3)$$

in which n is the degree of the grating. From the formulae (2) and (3), the phase diffference $\Delta\Omega$ between $\Omega_2$ and $\Omega_3$ can be expressed by the following formula:

$$\Delta\Omega = 2\pi n l \left( \frac{1}{\Lambda_0} - \frac{1}{\Lambda'} \right) \quad (4)$$

The formula (4) has no relation to $\Omega_1$. If the $\Delta\Omega$ is equal to $\pi + 2\pi m$, where m is an integer, a $\lambda/4$ phase shift can be generated. Therefore, using $\Delta\Omega = \pi + 2\pi m$, the following formula is applicable:

$$n l \left( \frac{1}{\Lambda_0} - \frac{1}{\Lambda'} \right) = \frac{1}{2} + m \quad (5)$$

The following formula can be obtained from the formulae (5) and (1):

$$l = (\tfrac{1}{2} + m) \left( \frac{\Lambda_0}{n} \right) \frac{1}{1 - \cos\theta} \quad (6)$$

in which $\theta \neq 0$. Accordingly, if the length l and angle $\theta$ of the bending portion 8b are subject to the formula (6), a $\lambda/4$ phase shifting corresponding to a $\pi$ phase shifting can substantially occur in the light transmitted along the ridge waveguide 8. For example, if $m = 0$ and $\Lambda_0/n = 0.125$ μm, $\theta = 5°$ and $l = 16.4$ μm, whereby it is easy to achieve the desired phase shifting.

As mentioned above, according to the preferred embodiment of the present invention, $\lambda/4$ phase shifting can be achieved by means of the bending portion 8b of the ridge waveguide 8, so that a single longitudinal oscillation mode can easily be obtained. In addition, $\lambda/4$ phase shifting can be achieved without special work, that is, without shifting the phase of the gratings 7 near the center of the ridge waveguide 8. Therefore, it is not difficult to manufacture a distributed feedback semiconductor laser according to the invention, so that the manufacturing yield of lasers may be raised.

The first straight-bar portion 8a may be connected to the second straight-bar portion 8c by means of the shape of the bending portion 8b comprising a smooth curved bar. In this case, there is an advantage in that the loss of light is small during the light's passage through it. The length l of the bending portion 8b is preferably less than about one-tenth of the whole length of the laser, that is, less than about one-tenth of the distance between the end face 6a and the opposing end face 6b.

The angle $\theta$ of the bending portion 8b is preferably less than 10° in order to lower the loss of light due to scattering. Although a ridge waveguide is used as an optical waveguide according to the aforementioned preferred embodiment of the invention, if necessary, various index waveguides such as a buried heterostructure (BH), or a rib and a channeled-substrate planar (CSP) may also be used for a distributed feedback semiconductor laser according to the invention. In addition, although a n-$Al_xGa_{1-x}As$ layer 2 and a p-$Al_xGa_{1-x}As$ layer 5 are used as cladding layers. $Al_yGa_{1-y}As$ layer 3 being used as a activating layer, and a p-$Al_zGa_{1-z}As$ layer 4 being used as a guiding layer, if necessary, various semiconductor layers may also be used.

Figure 4:
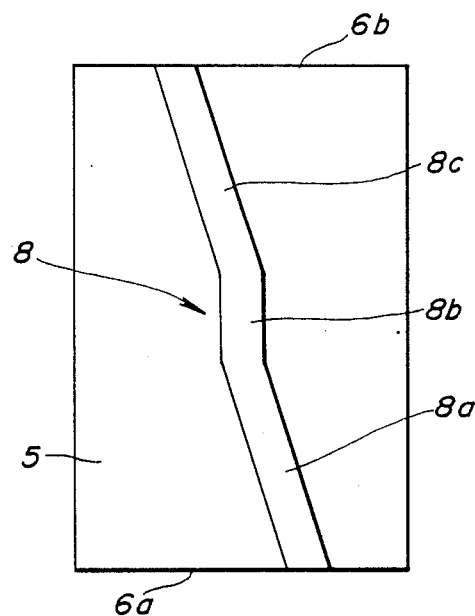
FIG. 4 is a plan view of another preferred embodiment of a distributed feedback semiconductor laser according to the invention.

FIG. 4 shows another embodiment of the invention, in which the straight-bar portions 8a and 8c are arranged parallel to each other, but at an angle relative to the direction perpendicular to the end faces 6a and 6b. Accordingly, there will be a phase shift in the bending portion 8b relative to the straight-bar portion 8a and 8c, in a similar manner to that in the arrangement of FIGS. 1 and 2.

While the present invention has been disclosed in terms of the preferred embodiment in order to facilitate a better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. A distributed feedback semiconductor laser comprising:

a semiconductor substrate of a first conductivity type having a major surface, said semiconductor substrate being connected to an electrode opposite the major surface for supplying a bias voltage;

a first semiconductor cladding layer of said first conductivity type, disposed on said major surface of said semiconductor substrate;

a laser active layer disposed on said first semiconductor cladding layer on the opposite side to said semiconductor substrate;

a semiconductor layer of a second conductivity type opposite said first conductivity type, which is disposed on said laser active layer and which has a periodically corrugated surface serving as a grating on the opposite side to said laser active layer, said periodically corrugated surface having peaks extending in a first direction;

a second semiconductor cladding layer of said second conductivity type, disposed on said periodically corrugated surface, said second semiconductor cladding layer being connected to another electrode for supplying bias voltage; and an optical waveguide which is formed on the surface of said second semiconductor cladding layer opposite to said periodically corrugated surface so as to guide laser light and which has first and second straight-bar portions extending in a second direction substantially transverse to said first direction and an intermediate portion which joins said first and second straight-bar portions, said intermediate portion being inclined to the second direction so as to shift the phase of the laser light by $\lambda/4$, $\lambda$ being the wavelength of the light.

2. A distributed feedback semiconductor laser as set forth in claim 1, wherein said grating is arranged in a regular pitch.

3. A distributed feedback semiconductor laser as set forth in claim 2, wherein said waveguide comprises:

a first straight-bar portion;

first and second straight-bar portions extending in said second direction, said second straight-bar portion being parallel to but not collinear with said first straight-bar portion.

4. A distributed feedback semiconductor laser as set forth in claim 3, wherein said intermediate portion extends at an angle $\theta$ from said first straight-bar portion.

5. A distributed feedback semiconductor laser as set forth in claim 4, wherein said intermediate portion is arranged so that the effective pitch of said grating along said intermediate portion is a little longer than that in the case of said first and second straight-bar portions.

6. A distributed feedback semiconductor laser as set forth in claim 5, wherein the relationship between the length l of said intermediate portion and the angle $\theta$ of said intermediate portion relative to said first and second straight-bar portions is subject to the following formula:

$$l = (\tfrac{1}{2} + m)\left(\frac{\Lambda_0}{n}\right)\frac{1}{1-\cos\theta}$$

in which $\theta$ is not 0°, $\Lambda_0$ is actual grating pitch, n is the degree of the grating, and m is an integer.

7. A distributed feedback semiconductor laser as set forth in claim 6, wherein the length l of said intermediate portion is less than about one-tenth of overall length of the laser.

8. A distributed feedback semiconductor laser as set forth in claim 7, wherein said angle $\theta$ is less than 10°.

9. A distributed feedback semiconductor laser as set forth in claim 3, wherein said intermediate portion is smoothly curved between said first and second portions.

10. A distributed feedback semiconductor laser as set forth in claim 5, wherein said gratings have an essentially triangular cross section.

11. A distributed feedback semiconductor laser as set forth in claim 10, wherein said optical waveguide has an essentially rectangular cross section.

12. A distributed feedback semiconductor laser as set forth in claim 11, wherein said optical waveguide is a ridge waveguide.

13. A distributed feedback semiconductor laser as set forth in claim 6, wherein said first cladding layer comprises a n-type $Al_xGa_{1-x}As$ layer.

14. A distributed feedback semiconductor laser as set forth in claim 13, wherein said active layer comprise a $Al_yGa_{1-y}As$ layer, $y<x$.

15. A distributed feedback semiconductor laser as set forth in claim 14, wherein said semiconductor layer comprises a p-type $Al_zGa_{1-z}As$ layer, $y<z<x$.

16. A distributed feedback semiconductor laser as set forth in claim 15, wherein said second semiconductor cladding layer comprises a p-type $Al_xGa_{1-x}As$ layer.

17. A distributed feedback semiconductor laser as set forth in claim 5, wherein said optical waveguide is formed by a rib.

* * * * *